United States Patent
Wasa et al.

(10) Patent No.: US 7,120,978 B2
(45) Date of Patent: Oct. 17, 2006

(54) PROCESS OF MANUFACTURING A PIEZOELECTRIC ELEMENT

(75) Inventors: Kiyotaka Wasa, Nara (JP); Akira Unno, Kanagawa (JP); Tetsuro Fukui, Kanagawa (JP); Takanori Matsuda, Tokyo (JP)

(73) Assignees: Canon Kabushiki Kaisha, Tokyo (JP); Kiyotaka Wasa, Nara (JP)

( * ) Notice: Subject to any disclaimer, the term of this patent is extended or adjusted under 35 U.S.C. 154(b) by 0 days.

(21) Appl. No.: 09/880,757

(22) Filed: Jun. 15, 2001

(65) Prior Publication Data

US 2002/0076875 A1 Jun. 20, 2002

(30) Foreign Application Priority Data

Jun. 21, 2000 (JP) ............................. 2000-185795

(51) Int. Cl.
*H04R 17/00* (2006.01)
*B05D 5/12* (2006.01)

(52) U.S. Cl. ............... 29/25.35; 29/846; 252/62.9 PZ; 310/340; 310/341; 310/358; 427/100

(58) Field of Classification Search .............. 29/25.35, 29/846; 252/62.9 R, 62.9 PZ; 310/340, 310/341, 342, 358; 502/525; 427/100; 257/295
See application file for complete search history.

(56) References Cited

U.S. PATENT DOCUMENTS

| | | | |
|---|---|---|---|
| 5,155,658 A | 10/1992 | Inam et al. ............ | 365/145 |
| 5,446,484 A | 8/1995 | Hoisington et al. ....... | 347/68 |
| 5,453,262 A * | 9/1995 | Dawson et al. ........... | 501/124 |
| 5,500,988 A * | 3/1996 | Moynihan et al. ......... | 29/25.35 |
| 5,719,417 A * | 2/1998 | Roeder et al. ............ | 257/295 |
| 5,852,703 A | 12/1998 | Nashimoto ............. | 257/295 X |
| 5,950,292 A | 9/1999 | Dimos et al. ............. | 216/13 X |
| 5,995,359 A | 11/1999 | Klee et al. ............... | 361/305 |

FOREIGN PATENT DOCUMENTS

| | | | |
|---|---|---|---|
| EP | 0 698 490 A | 2/1996 | |
| EP | 0 877 430 | * 11/1998 | |
| EP | 0 877 430 A2 | 11/1998 | |
| EP | 0 930 165 | * 7/1999 | |
| EP | 0 930 165 A1 | 7/1999 | |
| EP | 0 969 530 | * 1/2000 | |
| EP | 0 969 530 A2 | 1/2000 | |
| JP | 63-2808 | * 1/1988 | ............. 502/525 X |

(Continued)

OTHER PUBLICATIONS

Farrey et al., "Growth and Characterization of Na 1/2 Bi 1/2 Tio3—K 1/2 Bi 1/2 TiO3—BaTiO3 Single Crystal Piezoelectrics", Applications of Ferroelectrics, Proceedings of the Eleventh IEEE International Symposium, Aug. 1998, pp. 551-554.*

(Continued)

*Primary Examiner*—A. Dexter Tugbang
(74) *Attorney, Agent, or Firm*—Fitzpatrick, Cella, Harper & Scinto

(57) ABSTRACT

A method of manufacturing a piezoelectric element structure having a supporting substrate and a piezoelectric film supported on the supporting substrate. A first layer, and a second layer having zirconium, each provided with a perovskite structure, are formed in that order on the supporting substrate. The two layers are formed to be in contact with each other or laminated through an intermediate layer. The temperature is set to 500° C. or more at the time of formation of the layers, and cooling is subsequently provided from the formation temperature at least to 450° C. with a cooling speed of 30° C./min or more.

12 Claims, 7 Drawing Sheets

FOREIGN PATENT DOCUMENTS

| | | | | | |
|---|---|---|---|---|---|
| JP | 2-177578 | * | 7/1990 | ................ | 29/25.35 |
| JP | 10-286953 | | 10/1998 | | |
| JP | 11-348285 | | 12/1999 | | |

OTHER PUBLICATIONS

English Translation of Office Action issued in Korean Application No. 10-2001-0035451, Official Letter, May 2003.*

Wasa et al, "Sputtering Technology" (English Translation of Japanese Published Article), Sep. 1992.*

"Sputtering Technologies", Kiyotaka Wasa and Shigetomo Hayakawa, Kyoritsu Publishing Co., Ltd., Sep. 20, 1992 (English Translation).

"Sputtering Technologies", Kiyotaka Wasa and Shigetomo Hayakawa, Kyoritsu Publishing Co., Ltd., Sep. 20, 1992.

D.V. Taylor et al., "Piezoelectric properties of rhombohedral Pb(Zr, Ti)$O_3$ films with (100), (111), and 'random' crystallographic orientation," Appl. Phys. Lett., vol. 76, No. 12, Mar. 20, 2000, pp. 1615-1617.

* cited by examiner

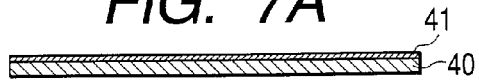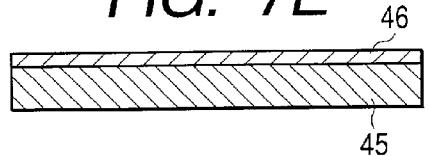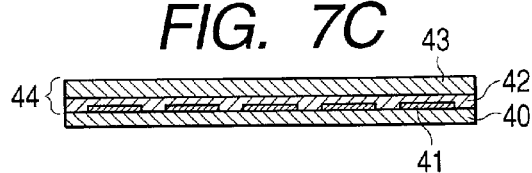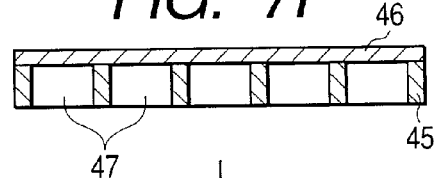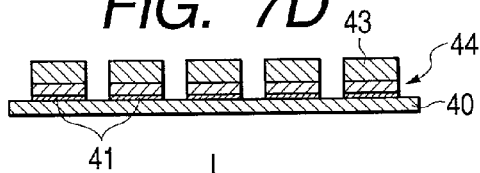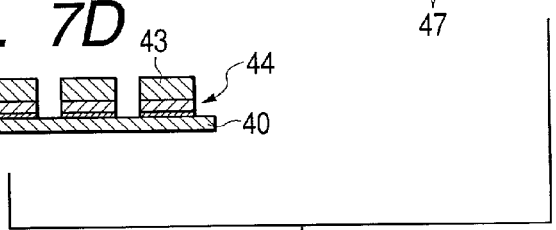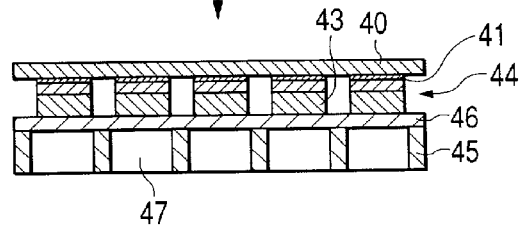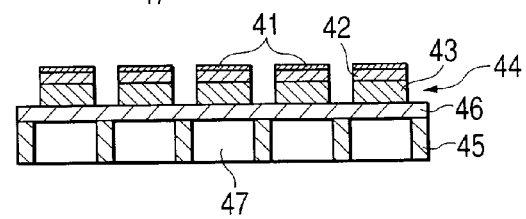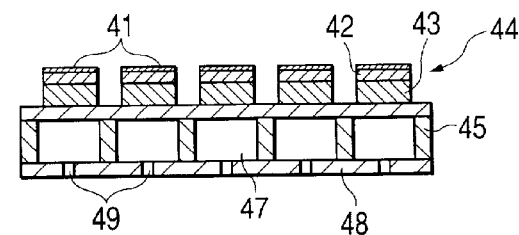

PROCESS OF MANUFACTURING A PIEZOELECTRIC ELEMENT

BACKGROUND OF THE INVENTION

1. Field of the Invention

The present invention relates to the liquid discharge recording head which is used for an ink jet recording apparatus, and the method of manufacture therefor. The invention also relates to the structure of piezoelectric element which is used for the liquid discharge recording head or the like.

2. Related Background Art

In recent years, there has been widely used the printer that adopts an ink jet recording apparatus as a printing device for a personal computer or the like, because of the good printing capability, as well as the easier handling and lower costs thereof, among some other advantages. The ink jet recording apparatus has various types, such as to generate bubbles in ink or some other recording liquid by the application of thermal energy, and discharge liquid droplets by means of pressure waves exerted by such bubbling; to suck and discharge liquid droplets by means of electrostatic power; or to discharge liquid droplets by utilization of pressure waves exerted by an oscillator like a piezoelectric element.

Generally, the one that uses the piezoelectric element is provided with the pressure chamber which is communicated with a recording liquid supply chamber, and the liquid discharge port which is communicated with the pressure chamber. Then, the structure is arranged to provide the pressure chamber with a vibrating plate having piezoelectric element bonded to it. With the structure thus arranged, a designated voltage is applied to each of the piezoelectric elements to allow it to stretch or shrink to generate warping vibrations in order to compress recording liquid in the pressure chamber, hence enabling liquid droplets to be discharged from each of the liquid discharge ports. In recent years, the color ink jet recording apparatus has been in use more widely, and along with this, it has been demanded to enhance the printing performance thereof, such as higher resolution, higher printing speed, and the elongation of recording head in particular. To this end, it has been attempted to materialize the higher resolution and higher printing speed by the provision of a multiple nozzle structure formed by a minutely arranged recording head. To minutely arrange the recording head, the piezoelectric element should be miniaturized for discharging recording liquid. In this respect, an elongated recording head can be manufactured in higher precision at lower costs by arranging the entire process to be completed by one continuous semiconductor film formation process.

However, a method adopted here is such as to form the piezoelectric film of piezoelectric element by burning the powdered PbO, $ZrO_2$, and $TiO_2$ which have been molded in the sheet form. Therefore, it is difficult to form the piezoelectric film in a thickness of less than 10 μm, for example. Thus, the piezoelectric film cannot be processed easily, and makes it difficult to miniaturize the piezoelectric element. Also, the piezoelectric film formed by burning such powder is subjected to being affected by the crystallized granular boundaries which cannot be ignored when the thickness of film is made smaller to make it impossible to obtain excellent piezoelectric characteristics. As a result, there is encountered a problem that the piezoelectric film formed by burning the powder cannot provide sufficient piezoelectric characteristics for discharging recording liquid when it is made thinner than 10 μm. Due to this incapability, it is impossible to materialize a small recording head with the necessary characteristics to discharge recording liquid satisfactorily.

Furthermore, in order to obtain ceramics in high density the dimensional changes due to shrinkage cannot be ignored for the powdered sheet when burning it on the vibration plate, and the structural member of ceramics simultaneously at a temperature of as high as 1,000° C. There is automatically a limit as far as the size is concerned. Here, 20 μm is the limit at present. It is made difficult, therefore, to arrange a plurality of liquid discharge ports (nozzles).

Also, there is proposed in the specification of Japanese Patent Laid-Open Application 11-348285, the structure of an ink jet recording head which is microprocessed by the semiconductor process using sputtering method. The proposed ink jet recording head is characterized in that platinum is orientationally filmed on monocrystal MgO, and then, the perovskite that does not contain Zr layer, and PZT layer are formed thereon to provide a laminated member. Now, as one of the inventors hereof has described precisely on pages 144 to 146 and others in the "Sputtering Technologies" under joint authorship with Kiyotaka Wasa and Shigetomo Hayakawa (published by Kyoritsu Publishing Co., Ltd., on Sep. 20, 1992), it has already been disclosed as an effective method to film PZT or PLZT after having filmed the $PbTiO_3$ or PLT, which does not contain Zr beforehand, but the lattice constant of which is not largely different, for example, or by introducing a step of making gradual increase during processing so as to change the film of PZT to that of PLT in that order. Here, the Zr is eventually educed to a substrate priorly when forming a piezoelectric member that contains Zr like PZT.

Further, the method proposed in the aforesaid specification of the laid-open application has significant problems as given below. (1) By the method of manufacture disclosed in the specification thereof, it is impossible to obtain any mono-orientational crystal or monocrystal PZT which is stabilized with good reproduciability. (2) By the method of manufacture disclosed in the specification thereof, it is impossible to obtain the orientated PZT but only on the monocrystal substrate which is extremely expensive, such as monocrystal MgO, leading to an extremely expensive processing eventually. Then, furthermore, the monocrystal substrate of MgO has a limit in its size to make it impossible to obtain a substrate having a large area. (3) In accordance with the method disclosed in the specification thereof, conjugation takes place on the joint portion of the pressure chamber (liquid chamber) member and the piezoelectric member by use of adhesive agent or in the vicinity of the piezoelectric member to make it extremely difficult to obtain reliability with respect to the repeated stress or the like in the area of micromachining which is accompanied by microprocessing.

SUMMARY OF THE INVENTION

It is an object of the present invention to provide an elongated liquid discharge recording head having the liquid discharge ports formed in high precision, and also, to provide a highly reliable and stable method for manufacturing such recording head, as well as the structure of piezoelectric element utilized for such recording head, for which it is made possible to perform the microprocessing used generally for the semiconductor process by developing a thin film material having large piezoelectric characteristics despite the small film thickness so that the piezoelectric member, the vibrating plate, and the like that constitute a piezoelectric element are structure in the from of thin film.

The piezoelectric element structure of the invention comprises a supporting substrate, and a piezoelectric film supported on the supporting substrate, in which the piezoelectric film contains a first layer, and a second layer having zirconium, each provided with perovskite structure, and formed to be in contact with each other or laminated through an intermediate layer, and the temperature at the time of thin film formation is 500° C. or more to provide the piezoelectric film, and for the formation thereof, a quick cooling is given from the thin film formation temperature at least to 450° C. with a cooling speed of 30° C./min or more.

For the piezoelectric element structure of the invention it is preferable that the first layer does not contain zirconium or the intermediate layer is in contact with the first layer and the second layer to reside between these layers, and the zirconium concentration increases inclinatorily. Further, it is preferable to make the amount of zirconium content of the first layer is smaller than the amount of zirconium content of the second layer.

In this manner, the piezoelectric film is structured to contain the first layer and second layer each having perovskite structure, which are formed to be in contact with each other. Then, these are filmed at a high temperature, and quickly cooled to make it possible to obtain a monocrystal PZT thin film having a large piezoelectric constant with small thickness and good piezoelectric characteristics, thus effectuating microprocessing.

Also, a first liquid discharge recording head of the invention comprises a main body portion provided with liquid discharge ports, and pressure chambers connected with the liquid discharge ports; a piezoelectric film having lead, titanium, and zirconium; and a piezoelectric vibrating portion provided partly for the pressure chambers containing electrodes arranged for both sides of the piezoelectric film, the vibrating portion being made to perform warping vibration to discharge recording liquid from the liquid discharge ports. For this recording head, the piezoelectric film contains a first layer having no zirconium, and a second layer having zirconium, each provided with perovskite structure, and formed to be in contact with each other, and the temperature at the time of thin film formation is 500° C. or more to provide the piezoelectric film, and for the formation thereof, a quick cooling is given from the thin film formation temperature at least to 450° C. with a cooling speed of 30° C./min or more.

A second liquid discharge recording head of the invention comprises a main body portion provided with liquid discharge ports, and pressure chambers connected with the liquid discharge ports; a piezoelectric film having lead, titanium, and zirconium; and a piezoelectric vibrating portion provided partly for the pressure chambers containing electrodes arranged for both sides of the piezoelectric film, the vibrating portion being made to perform warping vibration to discharge recording liquid from the liquid discharge ports. For this recording head, the piezoelectric film contains a first layer and a second layer, each provided with perovskite structure, and formed to be in contact with each other, and the amount of zirconium content of the first layer is smaller than the amount of zirconium content of the second layer, and then, the temperature at the time of thin film formation is 500° C. or more to provide the piezoelectric film, and for the formation thereof, a quick cooling is given from the thin film formation temperature at least to 450° C. with a cooling speed of 30° C./min or more.

A third liquid recording head of the invention comprises a main body portion provided with liquid discharge ports, and pressure chambers connected with the liquid discharge ports; a piezoelectric film having lead, titanium, and zirconium; and a piezoelectric vibrating portion provided partly for the pressure chambers containing electrodes arranged for both sides of the piezoelectric film, the vibrating portion being made to perform warping vibration to discharge recording liquid from the liquid discharge ports. For this recording head, the piezoelectric film contains a first layer having no zirconium, and a second layer having zirconium and an intermediate layer with the zirconium concentration thereof to be inclinatorily increased, each provided with perovskite structure, and formed to be in contact with each other, and the temperature at the time of thin film formation is 500° C. or more to provide the piezoelectric film, and for the formation thereof, a quick cooling is given from the thin film formation temperature at least to 450° C. with a cooling speed of 30° C./min or more.

For the liquid discharge recording heads thus structured, the piezoelectric film is structured to contain the first layer and the second layer, each provided with the perovskite structure and formed to be in contact with each other. Then, these are filmed at a high temperature and quickly cooled to form the second layer that contains Zr in good quality and in a small thickness, but with a large piezoelectric constant, thus making it possible to perform the microprocessing of the piezoelectric film. As a result, the liquid discharge recording head is formed in an extremely high precision, which is made small and light in weight, and in an elongated form.

For the liquid discharge head of the invention, it is preferable to set the ratio of zirconium/titanium in the second layer at 30/70 or more and 70/30 or less in order to enhance more the piezoelectric constant of the piezoelectric film.

For the liquid discharge recording head of the invention, the piezoelectric film should preferably be mono-orientational crystal or monocrystal so as to make it possible to utilize effectively the inherent piezoelectric constant of the material that forms the piezoelectric film.

For the liquid discharge recording head of the invention, it is preferable to form the piezoelectric film to be orientated in the direction (100) or (111). Also, for the piezoelectric film orientated in the direction (111), it is preferable to make the direction of the polarization process then an arbitrary direction, and arrange comb-shaped electrodes so as to apply electric field in the horizontal direction to the piezoelectric film, because the engineer domain occurs in the domain structure thereof. In this way, a high piezoelectric performance is made obtainable.

For the liquid discharge recording head of the invention, the piezoelectric film can be formed in a thickness of 10 μm or less to be able to process the shape of the piezoelectric film minutely. Further, the piezoelectric film is formed in a thickness of 1 μm or more and 4 μm or less to make it possible to process the piezoelectric film minutely, and to obtain a sufficient liquid discharge power, as well as a sufficient reliability for the piezoelectric film. Then, with the formation of the first layer of the piezoelectric film to be in a thickness of 30 nm or more and 100 nm or less, the second layer can be formed in good quality. There is no possibility, either, that the piezoelectric constant is lowered as the liquid discharge recording head if the temperature is set at 500° C. or more at the time of thin film formation, and the quick cooling is given from the thin film formation temperature at least to 450° C. with a cooling speed of 30° C./min or more.

For the liquid discharge recording head of the invention, the piezoelectric vibrating portion is provided with a vibrating plate o make it easier to enable the piezoelectric vibrating portion to perform warping vibrations. In this case, it is preferable to form at least one of materials or a laminated member of the materials selected from Ni, Cr, Al, Ti, and from the group of oxide thereof or nitride thereof, Si, Si oxide, YSZ, and polymer organic materials. Further, it is preferable to form them by use of sputtering.

For the liquid discharge recording head of the invention, it is preferable to form the vibrating plate by ion injection with the characteristics thereof on the upper part of the main body substrate constituting the pressure chambers. Particularly, on the surface layer of the silicon monocrystal substrate, boron is excessively doped to use it as the vibrating plate, and then, electrodes are formed directly on the silicon monocrystal substrate so as to form the two-layer structured piezoelectric film which is orientated in the direction (100) or (111).

For the liquid discharge recording head of the invention, it is preferable to form the vibrating plate by epitaxial development on a silicon monocrystal substrate.

For the liquid discharge recording head of the invention, the second layer of the piezoelectric film may be a piezoelectric element having antiferroelectricity that contains niobium and tin, and manganese.

For the liquid discharge recording head of the invention, it is preferable to form the electrode layers arranged for both side of the piezoelectric film with platinum, iridium, conductive oxide, or conductive nitride. In this way, it becomes possible to prevent the electrodes from being damaged by etching solution when the piezoelectric film is minutely processed by etching, for example. It is particularly preferable that the size of the lattice constant is not allowed to part by 30% or more in order to obtain the monocrystal PZT for the electrodes to be formed on the vibrating plate.

For the liquid discharge recording head of the invention, it is preferable that the main body portion is provided with a plurality of liquid discharge ports, and a plurality of the pressure chambers corresponding to each of liquid discharge ports, respectively, and from the electrodes arranged for both sides of the piezoelectric film, at least those on one side are separated for installation corresponding to the pressure chambers in order to structure the piezoelectric vibrating portion for each pressure chamber. With the structure thus arranged, a liquid discharge recording head can be manufactured with a plurality of liquid discharge ports formed in an extremely high density. In this case, it may be possible to separate the piezoelectric film so as to be arranged corresponding to the pressure chambers, and the electrodes on one side are formed on each of the separated piezoelectric film. Here, likewise, a liquid discharge recording head can be manufactured, which is provided with a plurality of liquid discharge ports formed in high density.

Further, the method of the present invention for manufacturing a liquid discharge recording head, which is provided with the main body portion having liquid discharge ports, and the pressure chambers with opening portion on part thereof, being connected with the liquid discharge ports, as well as provided with the piezoelectric vibrating portion installed to close the opening portion, comprises the steps of forming vibrating plate and electrode on a substrate; forming on the electrode a first layer having perovskite structure containing lead and titanium, and setting a temperature of 500° C. or more when forming on the first layer a second layer having perovskite structure containing zirconium, lead, and titanium, and then, giving quick cooling from the temperature at least to 450° C. with cooling speed of 30° C./min or more for forming piezoelectric film containing the first layer and second layer; separating the piezoelectric film after the formation of the piezoelectric film corresponding to pressure chambers; forming the upper electrode, and pressure chambers corresponding the separated piezoelectric films; and bonding a nozzle plate having liquid discharge ports formed therefor. For this method of manufacture, the first layer is formed so as not to contain zirconium or so as to make the amount of contained zirconium smaller than that of the second layer in the step of forming the piezoelectric film.

Also, the method of the invention for manufacturing a liquid discharge recording head, which is provided with the main body portion having liquid discharge ports, and pressure chambers with opening portion on part thereof, being connected with the liquid discharge ports, as well as provided with piezoelectric vibrating portion installed to close the opening portion, comprises the steps of forming on a supporting substrate a first layer having perovskite structure containing lead and titanium, and setting a temperature of 500° C. or more when forming on the first layer a second layer having perovskite structure containing zirconium, lead, and titanium, and then, giving quick cooling from the temperature at least to 450° C. with cooling speed of 30° C./min or more for forming piezoelectric film containing the first layer and second layer, and forming on the supporting substrate the piezoelectric vibrating portion having the piezoelectric film; bonding without using adhesive agent the circumference of the opening portion of the main body porion with the circumference of the piezoelectric vibrating portion by arranging them to be faced; and removing the supporting substrate subsequent to the step. For this method of manufacture, the first layer is formed so as not to contain zirconium or so as to make the amount of contained zirconium smaller than that of the second layer in the step of forming the piezoelectric vibrating portion.

For the method of manufacture of the invention, it is preferable to form the first layer, second layer, vibrating plate, and electrode by the vapor method including sputtering and CVD method. The piezoelectric film formed by the first layer and second layer can be formed in good precision and in good quality.

For the method of manufacture of the invention, it is preferable to use a silicon substrate as the substrate, and then, to remove the substrate by etching using a mixed acid of hydrochloric acid and nitric acid so as to make the interior thereof pressure chambers.

In accordance with the present invention, it is possible to form mono-orientational crystal or monocrystal PZT. Then, as compared with the conventional example, the piezoelectric film can be formed thin with a large piezoelectric constant. As a result, a microprocessing is made applicable to the piezoelectric film, thus providing an elongated liquid discharge recording head having liquid discharge ports formed in high density, which are also capable of performing high speed response. Further, it becomes possible to provide a highly reliable and stable method for manufacturing such liquid discharge recording head. Consequently, it is possible to realize an ink jet recording apparatus capable of printing in high resolution at high speed by use of the small liquid discharge recording head having the liquid discharge ports formed in high density.

BRIEF DESCRIPTION OF THE DRAWINGS

FIGS. 7A, 7B, 7C, 7D, 7E, 7F, 7G, 7H, and 7I are views which schematically illustrate the main steps of still another method for manufacturing the liquid discharge recording head of the present invention.

DETAILED DESCRIPTION OF THE PREFERRED EMBODIMENTS

Hereinafter, in conjunction with the accompanying drawings, the embodiments will be described in accordance with the present invention.

Figure 1A:
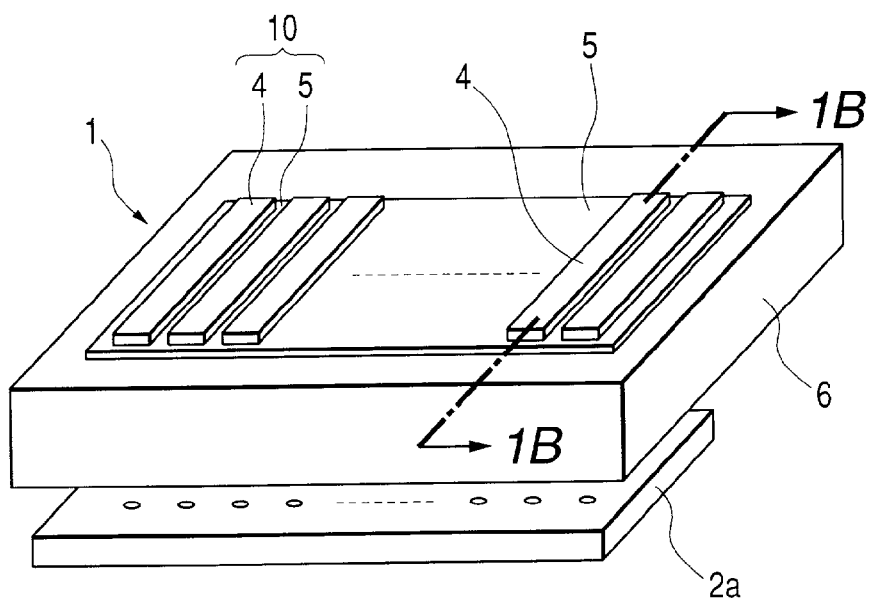
FIG. 1A is a perspective view which shows a liquid discharge head in accordance with the present invention.
Figure 1B:
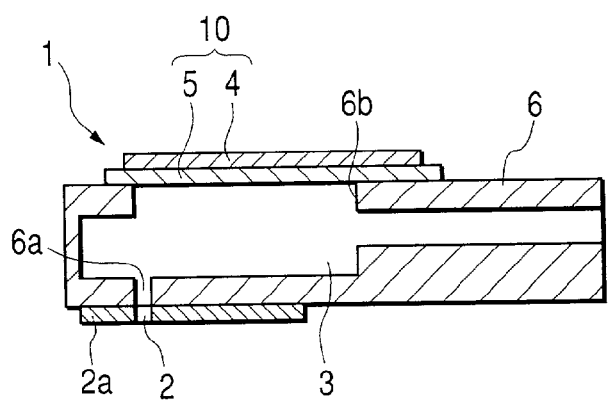
FIG. 1B is a cross-sectional view taken along line 1B—1B in FIG. 1A.
Figure 1C:
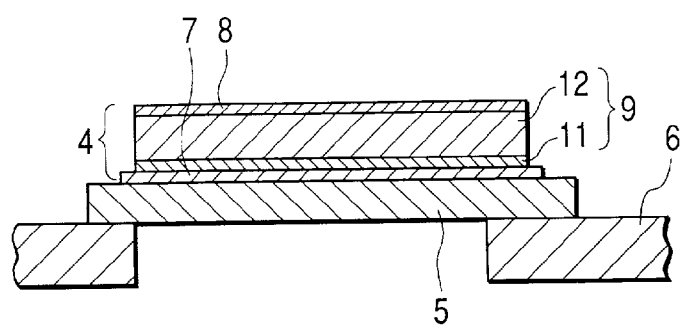
FIG. 1C is a partially sectional view which shows the piezoelectric vibrating portion in enlargement for the liquid discharge recording head of the invention.

Of FIGS. 1A to 1C, FIG. 1A is a perspective view which shows a liquid discharge head in accordance with the present invention. FIG. 1B is a cross-sectional view taken along line 1B—1B in FIG. 1A. FIG. 1C is a partially sectional view which shows the piezoelectric vibrating portion in enlargement for the liquid discharge recording head of the invention.

For the liquid discharge recording head of the present invention, a film formation is executed at a temperature of as high as 500° C. or more using the so-called thin film orientational formation method, such as the sputtering which is regarded as a difficult method to be executed for the purpose conventionally. Then, this head is structured by use of a thin piezoelectric film of monocrystal or mono-orientational crystal having a large piezoelectric constant, which is formed by quick cooling from the temperature of think film formation at least to 450° C. at a cooling speed of 30° C./min or more. Thus, as compared with the conventional liquid discharge recording head, this one is made extremely small, and characterized in that the liquid discharge ports are formed by a simple method of manufacture at small intervals. Moreover, silicon is used for the substrate on which the monocrystal or mono-orientational crystal piezoelectric film is formed to make it possible to provide an elongated liquid discharge recording head in high density and high precision at low costs, because the semiconductor process can be utilized for executing the manufacturing process for this head.

As shown in FIGS. 1A and 1B, the liquid discharge recording head of the present invention is provided with a plurality of discharge ports 2; a pressure chamber 3 arranged corresponding to each of the liquid discharge ports 2; and a piezoelectric element 4 installed corresponding to each of the pressure chamber 3, respectively, and structured as given below. Here, in FIGS. 1A and 1B, each liquid discharge port 2 is arranged on the lower face side, but may be arranged on the side face side.

For the liquid discharge recording head 1, the liquid discharge ports 2 are formed on the nozzle plate 2a at designated intervals, and the pressure chambers 3 are formed side by side on the main body portion (liquid chamber substrate) 6 corresponding to the liquid discharge ports 2, respectively. The pressure chamber 3 that faces each liquid discharge port 2 is connected through a liquid flow path 6a formed for the main body portion 6. Also, on the upper face of the main body portion 6, opening portions 6b are formed correspond to each of the pressure chambers 3. Then, a vibrating plate 5 is formed on the upper face of the main body portion 6 to cover each of the opening portions 6b. On the vibrating plate 5, each of the piezoelectric elements 4 is arranged to be positioned on each of the opening portions 6b corresponding to each of the pressure chambers 3.

Also, as shown in FIG. 1C, the piezoelectric element 4 comprises platinum (Pt) electrodes 7 and 8 each in a thickness of 0.1 μm, and a piezoelectric film 9 of 3 μm thick formed between the electrodes 7 and 8. Then, this element is installed on the vibrating plate 5. Here, the vibrating plate 5 is formed by the vibrating portion of YSZ layer (yttrium stabilized zirconia or also called stabilized zirconia) of 3 μm thick. In this way, a piezoelectric vibrating portion 10 is formed by each of the piezoelectric elements 4 and the vibrating plate 5.

Perovskite type PZT thin film material, which is an oxide composed by lead, titanium, and zirconium, is used as the martial of the piezoelectric film 9, hence making it possible to exert vibration in good condition even at low voltage. In this respect, when reference is made simply to the PZT in the specification hereof, it means the piezoelectric material which is expressed by the general formula of $Pb(Zr_xTi_{1-x})O_3$ containing Pb, Zr, and Ti. The composition of this PZT thin film is made clear to indicate the maximum piezoelectric effect as a sintered member in the case of $Pb(Zr_{0.53}Ti_{0.47})O_3$. However, it is not easy to from this compositional thin film directly on electrodes.

Now, therefore, in accordance with the present invention, the piezoelectric film 9 is structured with two layers as shown in FIG. 1C. As a first layer 11, (Pb, La)TiO$_3$ (hereinafter simply referred to as PLT) is formed by adding lanthanum to the PbTiO$_3$ or PbTiO$_3$ which does not contain Zr. As a second layer 12, a compositional layer of Pb $(Zr_{0.53}Ti_{0.47})O_3$ is formed. Then, the high quality piezoelectric thin film (piezoelectric film 9) is formed with excellent piezoelectric characteristics at a high temperature (more than 500° C.) at the time of film formation, which is quickly cooled from this film formation temperature at least to 450° C. with a cooling speed of 30° C./min or more.

Figure 2A:
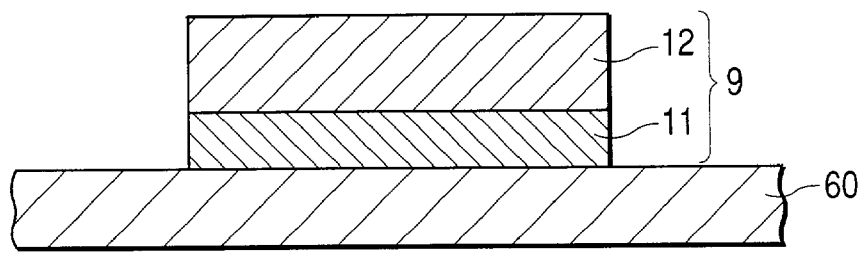
FIGS. 2A, 2B, and 2C are views which schematically illustrate the two-layered structure of the piezoelectric film, respectively, in accordance with the present invention.

In other words, it has been found to be able to complete a high quality piezoelectric think film with excellent piezoelectric characteristics in such a manner that the PLT is formed as a first layer 11 by adding lanthanum to the PbTiO$_3$ or PbTiO$_3$ which does not contain Zr, and as a second layer 12, a compositional layer of Pb $(Zr_{0.53}Ti_{0.47})O_3$ is formed as shown in FIG. 2A, and that the film is formed at the high film formation temperature, and by the subsequent quick cooling as described earlier.

Now, hereunder, the detailed description will be made of the two-layered piezoelectric film.

As has been described above, the PZT has an excellent piezoelectric characteristics. Then, it is known that when the Zr/Ti ratio becomes almost 50/50, this element presents an extremely high piezoelectric coefficient. However, it is not easy to form a good film with the PZT using the thin film formation method, such as sputtering, CVD, among some others. When the ratio of Zr becomes greater against Ti, this tendency becomes more conspicuous. This is because as disclosed on pages 144 to 146, the "Sputtering Technologies" (published by Kyoritsu Publishing Co., Ltd.), which is referred to earlier herein, the Zr oxide is adsorbed to the surface of substrate in the process of forming a thin film, and it is known that thereafter, this adhesion impedes the growth of the film. Also, it is clear that such tendency is more conspicuous in a case where the PZT film is attempted to be developed on the Pt electrodes. However, if the PZT is developed by use of the thin film formation method on the (Pb, La) $TiO_3$ (that is PLT) the crystallization temperature of which is lowered by adding $PbTiO_3$ or by adding La of approximately 10 mol % to $PbTiO_3$, it becomes possible to produce good PZT film without educing Zr oxide. Here, this is not good enough, nevertheless, in order to obtain the mono-axially mono-orientational crystal or mono-crystal film which the present invention intends to secure. The inventors hereof have assiduously studied, therefore, to obtain a mono-orientational crystal or monocrystal thin film which is formed more completely to be uniform. As a result, it has been found that the cooling speed beginning with the film formation temperature and time is an extremely important factor to obtain a uniformly mono-orientational crystal or monocrystal.

For example, as shown in FIG. 2A, $PbTiO_3$ or PLT is filmed as the first layer 11 on the supporting base plate 60, and when PZT is formed thereon as the second layer 12, the temperature is set at 600° C. at the time of film formation. Then, the cooling speed is changed variously from the film formation temperature at least to 450° C. to examine the orientational ratio of the PZT at the time of film formation. The results thereof are shown on Table 1 and Table 2. On the Table 1, the $PbTiO_3$ (serving as the first layer) is formed in a thickness of 0.2 μm on the supporting base plate 60 formed by MgO(100)/Pt, and when the PZT (serving as the second layer) is formed in a thickness of 2.8 μm thereon, the film formation temperature is set at 600° C. Then, the results of examination on the orientational ratio of PZT are indicated with various changes of cooling speed from the film formation temperature to 450° C. At this juncture, when the $PbTiO_3$ is filmed on the Pt orientated at the c axis by changing the cooling speeds, the direction of the $PbTiO_3$ orientation is at the a axis or at the c axis, or, further, at the mixture thereof depending on the cooling speeds. Further, when the PZT is formed thereon, the monocrystal film is obtained, the axial orientation of which is influenced by the cooling speeds likewise irrespective of whether the formation is continuous or not. Particularly, when the cooling speed is made slower, the mono-orientational crystal or monocrystal growth cannot be obtained for the film thereon. The reasons are not clear, but the a axially orientational portions are observed by the X ray analysis in some cases. However, with the quick cooling at the cooling speed of 30° C./min or more, it is possible to form the c axially orientational monocrystal having a large piezoelectric constant, because the PZT that contains Zr is made thinner in good quality, yet at the c axial orientation ratio of 80% or more. Further, with the cooling speed of 60° C./min, the c axial orientation ratio becomes 95% or more. In this way, the monocrystal PZT thin film having a large piezoelectric constant with the c axis orientation can be formed by setting the cooling speed at 30° C./min or more. On the Table 2, the $PbTiO_3$ (serving as the first layer) is formed in a thickness of 0.2 μm on the supporting base plate formed by Si(111)/YSZ (111)/Pt, and when the PZT (serving as the second layer) is formed in a thickness of 2.8 μm thereon, the film formation temperature is set at 600° C. Then, the results of examination on the orientational ratio of PZT are indicated with various changes of cooling speed from the film formation temperature to 450° C. As understandable from the results, when the quick cooling is performed at the cooling speed of 30° C./min or more from the film formation temperature of 600° C. to 450° C., the axially orientational ratio of the (111) becomes 80% or more, thus making it possible by the PZT that contains Zr to form the thin monocrystal having the (111) axial orientation with a large piezoelectric constant. Further, with the cooling speed of 60° C./min, the (111) axial orientation ratio becomes 95% or more. In this way, the monocrystal PZT thin film having a large piezoelectric constant with the (111) orientation can be formed by setting the cooling speed at 30° C./min or more.

TABLE 1

Orientational Ratio of PZT Film

| | Cooling Speed ° C./min | | | | | |
|---|---|---|---|---|---|---|
| | 100 | 80 | 60 | 30 | 20 | 10 |
| c Axial Orientation Ratio | 100% | 98% | 95% | 80% | 50% | 10% |
| a Axial Orientation Ratio | 0% | 2% | 5% | 20% | 40% | 70% |
| R | R0% | R0% | R0% | R0% | R10% | R20% |

Orientational ratio with cooling speeds being changed at 600° C., the temperature at which to form $PbTiO_3$ in 0.2 μm and PZT in 2.8 μm on MgO (100)/Pt substrate
(Here, R designates random orientations)

TABLE 2

Orientational Ratio of PZT Film

| | Cooling Speed ° C./min | | | | | |
|---|---|---|---|---|---|---|
| | 100 | 80 | 60 | 30 | 20 | 10 |
| c Axial Orientation Ratio | 100% | 98% | 95% | 80% | 50% | 30% |
| a Axial Orientation Ratio | 0% | 2% | 5% | 20% | 40% | 50% |
| R | R0% | R0% | R0% | R0% | R10% | R20% |

Orientational ratio with cooling speeds being changed at 600° C., the temperature at which to form $PbTiO_3$ in 0.2 μm and PZT in 2.8 μm on Si(111)/YSZ(111)/Pt substrate
(Here, R designates random orientations)

In other words, with the high temperature film formation and the quick cooling, it becomes possible to obtain the PLT(100), PZT(100) if the base electrode is (100) having the lattice constant which is almost the same as that of the PZT, and further, to obtain the PLT(111), PZT(111) if the base electrode is (111).

Figure 2B:
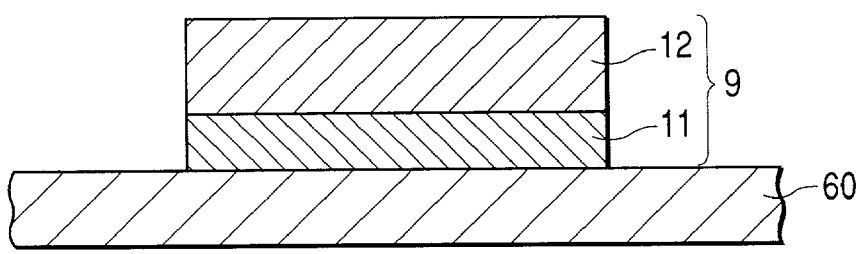

Also, as regards the two-layered structure of the piezoelectric film, there is the one as shown in FIG. 2B, besides the structure shown in FIG. 2A, in which the first layer 11 and the second layer 12 are both formed by the PZT, but the amount of Zr content in the first layer 11 is made small as compared with the amount of Zr content in the second layer 12. Then, the piezoelectric film 9 is formed at the temperature of 500° C. or more at the time of film formation with the quick cooling at the cooling speed of 30° C./min or more. With the piezoelectric film thus formed, it is possible to obtain the same effect. In other words, as the piezoelectric material for the first layer (initial layer) that forms the piezoelectric film, the PZT layer formed by the Pb(Zr$_x$Ti$_{1-x}$)O$_3$ set at x<0.3 or the layer that contains La layer for such layer is used, and even if the second layer is formed by use of the PZT layer having the Pb(Zr$_x$Ti$_{1-x}$)O$_3$ set at 0.7≧x≧0.3, the second layer can be formed with good crystallization and a comparatively large piezoelectric constant. In this case, it is preferable to use particularly as the first layer the PZT layer formed by the Pb(Zr$_x$Ti$_{1-x}$)O$_3$ set at x<0.2 or the layer that contains La for such layer. Here, it is equally possible to obtain an excellent piezoelectric material formed at the film formation temperature of 500° C. or more and cooled to 450° C. with the cooling speed of 30° C./min or more.

Figure 2C:
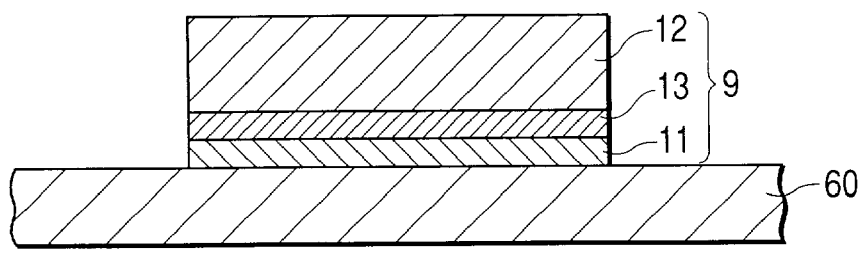

Further, it is possible to obtain the same effect by use of the piezoelectric film that films the PZT as the second layer 12 through the intermediate layer 13 having the compositional inclination in which the Zr density is increased continuously from the PbTiO$_3$ or the PLT that does not contain Zr as the first layer 11 and continuously changed to the composition near the Pb(Zr$_{0.5}$Ti$_{0.5}$)O$_3$ as shown in FIG. 2C. This is disclosed in the aforesaid "Sputtering Technologies" (Published by Kyoritsu Publishing Co., Ltd.) pages 144 to 146 and others.

As described above, when a liquid discharge recording head is manufactured by use of the semiconductor process, it is a point of whether or not an excellent liquid discharge recording head can be manufactured that the vibrating plate is epitaxially developed on the monocrystal substrate appropriately so that the electrodes can be filmed in agreement with a desired lattice constant or not.

Now, hereunder, the description will be made of the structure of a liquid discharge recording head, and the method of manufacture therefor, in which all the orientations are successfully made from the substrate to the piezoelectric material formed by the inventors hereof.

At first, with reference to FIGS. 3A to 3D which illustrate the main processing steps, the description will be made of a method for manufacturing a liquid discharge recording head in accordance with the present invention.

Figure 3A:
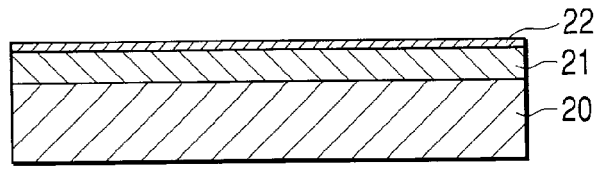
FIGS. 3A, 3B, 3C, and 3D are views which schematically illustrate the main steps of a method for manufacturing the liquid discharge recording head of the present invention.

As shown in FIG. 3A, YSZ (stabilized zirconia) 21 is epitaxially developed by sputtering on a monocrystal (100) silicon substrate 20 (500 μm) at a substrate temperature of 800° C. The film thickness thereof is 3 μm. At this juncture, the surface is rinsed by use of KOH for the purpose to remove the oxide film on the silicon surface. Further, for the prevention of its oxidation, a metal Zr may be filmed. The YSZ layer 21 acts as a vibrating plate. Then, the Pt electrode film (common electrode) 22 which is orientated on the YSZ layer 21 is filmed in a film thickness of 0.1 μm. When this Pt electrode film 22 is formed, SiO$_2$ and TiO$_2$ are filmed one after another as buffer film on the YSZ layer 21, and then, the Pt electrode film 22 can also be formed thereon in order to obtain the oriented Pt film.

Figure 3B:
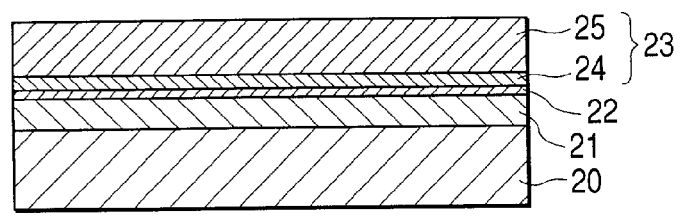

Subsequently, as shown in FIG. 3B, a piezoelectric film 23 of two-layered structure is formed by the rf sputtering method on the Pt electrode film 22 thus oriented. Here, the piezoelectric film 23 is formed by the first layer 24 of the lead dielectric (PbTiO$_3$) that does not contain Zr and the second layer 25 of the PZT that contains Zr, which are heated at the film formation temperature of 500° C. or more and cooled with the cooling speed of 30° C./min or more as described earlier. The piezoelectric film 23 thus structured utilizes the orientational surface (100) of the silicon monocrystal substrate 20 for making the orientated YSZ film 21 a vibrating plate (100) as it is. Then, the PZT which has been filmed on the oriented Pt electrode film 22 can also obtain the monocrystal film which is orientated in the direction (100). Here, for the electrode film, an electrode film of Ir, Ir$_2$O$_3$, SRO, or the like, other than the Pt, may be epitaxially developed on the vibrating plate to obtain a monocrystal film with the PZT thereon being orientated in the direction (100). As has been described, the silicon substrate and lattice are matched when the vibrating plate is formed. As a result, the close contactness is intensified, and also, the mechanical strength of the YSZ layer itself becomes greater to optimize the plate as the vibrating one for a recording head. The inventors hereof have succeeded in obtaining the PZT (100) under the conditions of PZT film formation which are generally subjected to producing a polycrystalline substance, but by combining the film formation processes in consideration of the matching of monocrystal silicon substrate, orientational vibrating plate, electrodes, and buffering films with each of lattices, while using the silicon processing steps in order to complete the manufacture of a liquid discharge recording head by one continuous semiconductor process.

Figure 3C:
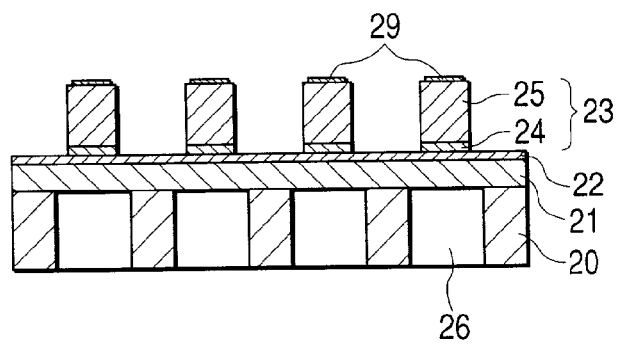

Next, as shown in FIG. 3C, the piezoelectric film 23 is separated by patterning so as to configure each of the pressure chambers 26 to be in the divided form. Then, the silicon substrate 20 is partially removed by etching by use of hydrofluoric acid solution or potassium hydroxide solution to use part of silicon substrate 20 as the structural member of the pressure chamber 26, and the upper electrode (individual electrode) 29 is formed on the piezoelectric film 23.

Figure 3D:
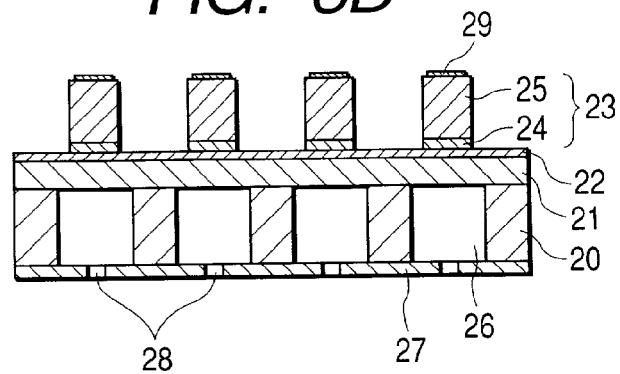

After that, as shown in FIG. 3D, the nozzle plate 27 having a plurality of liquid discharge ports 28 formed thereon is positioned on the lower side of the pressure chamber 26 of the silicon substrate 20 to be bonded thereto, hence completing the recording head.

Figure 4:
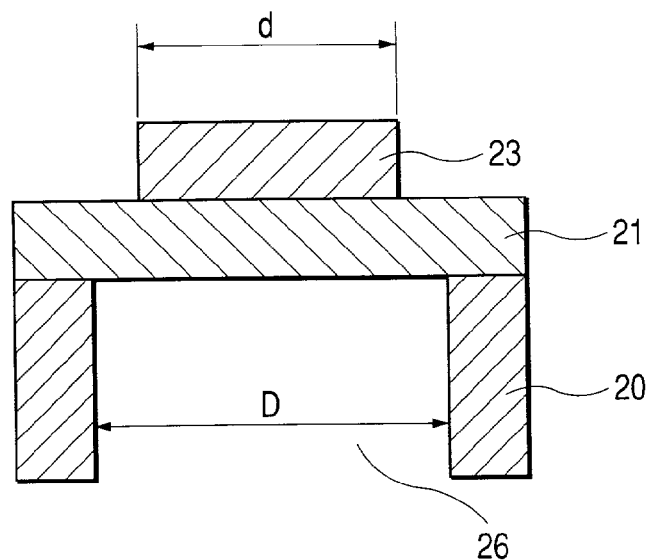
FIG. 4 is a cross-sectional view which shows schematically the relations between the piezoelectric film and the pressure chamber of the liquid discharge recording head of the present invention.
Figure 5A:
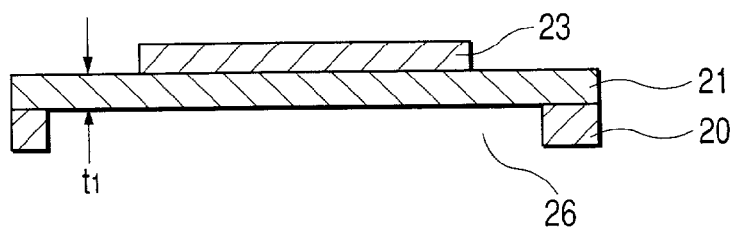
FIGS. 5A and 5B are cross-sectional views which schematically illustrate the relations between the piezoelectric film and the vibrating plate of the liquid discharge recording head of the present invention.
Figure 5B:
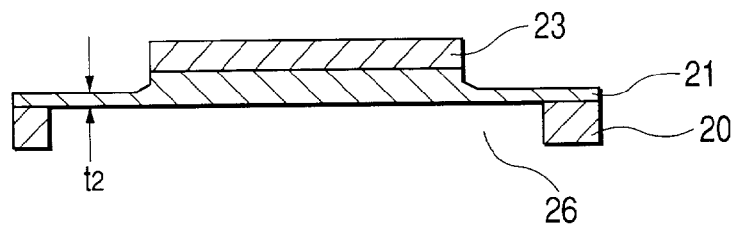

In this respect, when the piezoelectric film 23 is separated by etching corresponding to each pressure chamber 26, it is preferable to make the width (d) of each piezoelectric film 23 smaller than the width (D) of the pressure chamber 26 as shown in FIG. 4. The ratio thereof is 60% to 90% (0.6≦d/D≦0.9). Also, when the piezoelectric film 23 is separated for formation, it may be possible to fill in the resin having lower robustness that does not hinder the piezoelectric film to be stretched and shrunk, such as polyimide resin, between the separated piezoelectric films 23. In this way, the piezoelectric film can be vibrated without hindering the stretching and shrinking of the piezoelectric film in the horizontal direction. Thus, the reliability of the recording head is enhanced without deteriorating the vibrating characteristics. Further, it becomes possible to obtain a large amount of displacement by arranging the thickness (t$_1$) of the vibrating plate 21 to be larger on the portion having the piezoelectric film 23 (t$_1$) and smaller on the portion having no piezoelectric film 23 (t$_2$) as shown in FIG. 5B. Particularly, it is preferable to arrange them to be t$_2$/t$_1$≦0.8.

Also, the YSZ film orientated in the direction (100) is formed on the monocrystal (111) silicon substrate through the buffering film. Then, SiO and ZrN are formed as buffering film thereon, and further, the Pt electrode film is formed thereon. The Pt electrode film is orientated in the direction (100) so that the PZT orientated in (100) can be filmed thereon. Further, the YSZ orientated in (111) is filmed on the monocrystal (100) silicon substrate through buffering film, and SiO$_2$ and ZrN are formed as buffering film thereon, thus forming the Pt film thereon. At this juncture, the Pt electrode film is orientated in the direction (111), and then, with the formation of the PZT on the Pt electrode film, it becomes possible to obtain the PZT orientated in (111). At this juncture, the YSZ is orientated in the direction (111) to become a vibrating plate excellent in crystallization. Then, further, using the monocrystal (111) silicon substrate the YSZ is orientated in the direction (111), hence making it possible to obtain likewise the PZT orientated in the direction (111).

Now, with reference to FIGS. 6A to 6E which illustrate the main processing steps, the description will be made of another method for manufacturing a liquid discharge recording head in accordance with the present invention.

For the present embodiment, although the aspect where the orientated PZT is used is the same, the vibrating plate is not filmed on the silicon. Here, the surface layer of silicon is utilized for a vibrating plate as it is. Then, the PZT orientational monocrystal film, which is invented by the inventors hereof, is formed hereon.

Hereunder, the processing steps will be described.

Figure 6A:
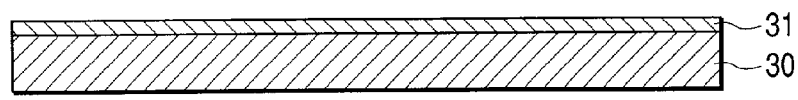
FIGS. 6A, 6B, 6C, 6D and 6E are views which schematically illustrate the main steps of another method for manufacturing the liquid discharge recording head of the present invention.

As shown in FIG. 6A, B (boron) is doped excessively on the surface of a silicon monocrystal substrate 30. Then, ion is injected up to the density of 10 to the thirteenth power. Particularly, the accelerating voltage is controlled so as to inject ion to the portion of approximately 3 μm from the surface for the formation of the B doped layer 31 on the surface of the silicon substrate 30, which is utilized as a vibrating plate.

Next, the Pt electrode (common electrode) 32 is formed on the B doped layer 31. In this case, too, $TiO_2$ and $SiO_2$ may be used as buffering film in order to obtain the orientated Pt surface. For the present embodiment, the Pt electrode 32 is filmed after $TiO_2$ of 1000 A and $SiO_2$ of 200 A are filmed on the monocrystal silicon substrate 30. The Pt electrode 32 thus obtained has been developed epitaxially in (111). Besides the X-ray observation, the sectional lattice image is observed by use of TEM. The regularly aligned crystals are observed.

Figure 6B:
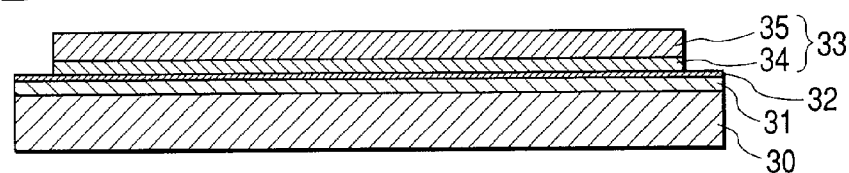

Then, as shown in FIG. 6B, the piezoelectric film 33 having the $PbTiO_3$ (the first layer) 34 and the PZT (the second layer) 35 is formed on the Pt electrode 32. The film thickness are 0.1 μm and 2.9 μm, respectively, and in accordance with the present embodiment, a multiple sputter apparatus is used to continuously form the film at high temperature with the subsequent quick cooling.

Figure 6C:
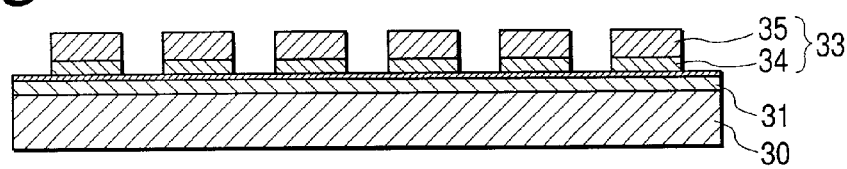
Figure 6D:
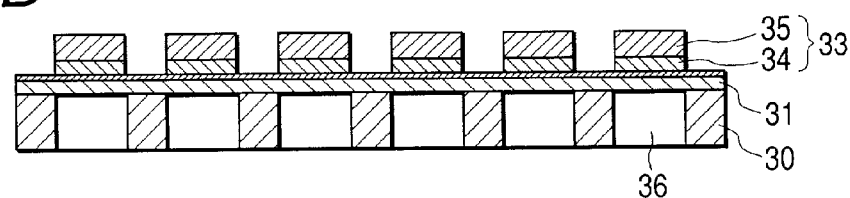

Next, the piezoelectric film 33 is etched. With resist as a mask, etching is performed using thermally concentrated phosphoric acid to make the width of the film to be 70% of the width of the pressure chamber 36, thus separating the piezoelectric film 33 (FIG. 6C). Then, the portion of the silicon substrate 30 to abut against the pressure chamber 36 is removed by means of dry etching using vacuum method (FIG. 6D).

Figure 6E:
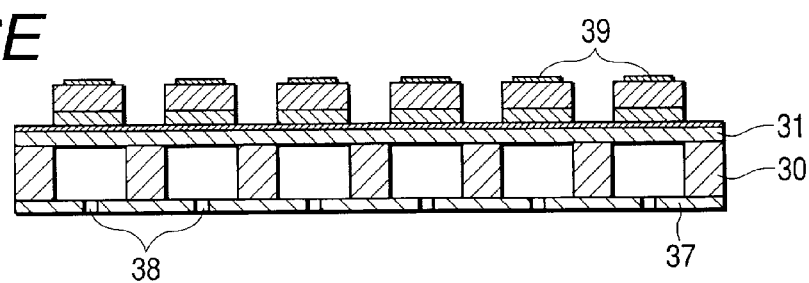

Then, as shown in FIG. 6E, the upper electrode (individual electrode) 39 is formed on the piezoelectric film 33. Lastly, the nozzle plate 37 having liquid discharge ports (nozzles) 38 is formed by silicon or SUS, and directly bonded to the pressure chamber 36, thus completing the liquid discharge recording head.

Also, by use of the surface layer of approximately 3 μm which is obtained by doping B (boron) on a silicon monocrystal layer up to 10 to the thirteenth power, the MgO monocrystal layer formed by sputtering thereon in a thickness of 0.2 μm as the vibrating plate 31. The common electrode 32 and the individual electrode 39 are structured by the Pt layer of 0.1 μm, respectively. The thickness of the surface layer 31 should preferably be the same as or smaller than the thickness of the piezoelectric film 33 in order to obtain good liquid discharge performance.

It is preferable for the piezoelectric film 33 that the width of the piezoelectric film 33 is smaller than that of the corresponding pressure chamber 36. However, the present invention is not limited thereto. The arrangement may be made so that using one piezoelectric film which is not separated, while the individual electrode 29 is formed corresponding to each of the pressure chambers 36, only the part of the piezoelectric film layer that faces each pressure chamber is vibrated to discharge ink.

Also, polyimide resin may be filled in as a filler between the separated piezoelectric films 33 adjacent to each other. Here, the filler is not necessarily limited to polyimide resin. Any material the robustness of which is comparatively low may be usable. With the use of a material having comparatively low robustness as a filler, the piezoelectric film can be vibrated without hindering the stretching and shrinking of the piezoelectric film in the horizontal direction. For example, the width of the pressure chamber 36 is assumed to be 70 μm, and if the width of the piezoelectric film 33 is made slightly smaller than that of the pressure chamber 36, it can change 800 nm at the maximum with the application of voltage at 10V.

As described above, in accordance with the present embodiment, the piezoelectric film 33 is structured to be two layered, the first and second layers, and formed by use of thin film formation method, such as sputtering, which is used as a vibrating plate by excessively doping boron on the surface layer of a silicon monocrystal substrate. In this way, electrodes are formed directly on the silicon substrate, and the piezoelectric film of the two-layer structure can be formed by orientating it in the directions of (100) and (111). At this juncture, $SiO_2$ and $TiO_2$ buffering film can be used between platinum and silicon. Further, MgO buffering film may be usable.

Also, microprocessing is difficult if the thickness of the piezoelectric film 32 becomes 10 μm or more. Therefore, it is preferable to arrange the thickness of the piezoelectric film 32 to be less than 10 μm or more preferably, it is set at 8 μm or less.

As the substrate, silicon monocrystal is used, and on the surface thereof, B (boron) is doped excessively so as to use the thin surface layer as the vibrating plate. MgO is epitaxially developed thereon, and then, the first layer (initial layer) that does not contain Zr is formed thereon. After that, the piezoelectric film which is expressed by the general formula of $(Pb_{1-x}La_x)(Zr_{1-y}Ti_y)O_3$ is formed on the initial layer. In this way, the orientated piezoelectric film can be formed. As described above, the La is added to the piezoelectric film expressed by the general formula of $Pb(Zr_{1-y}Ti_y)O_3$, thus lowering the crystallization temperature to enhance the piezoelectric capability of the thin piezoelectric film. Further, with the monocrystalline $(Pb_{1-x}La_x)(Zr_{1-y}Ti_y)O_3$ thus formed, it becomes possible to obtain the piezoelectric constant 10 times that of the polycrystal member of the same composition. Also, as the method for forming the piezoelectric film, sputtering or CVD is used to make it possible to form the monocrystal film having good crystallization at a quick deposition speed of 1 μm or more per hour. Further, using platinum or ruthenium oxide as the piezoelectric material it becomes possible to develop the piezoelectric film while maintaining good surface characteristics. Also, in place of MgO, ZrN, TiN may be used without any problem. Further, this method of processing can be simplified to produce an excellent effect on the large-scale productivity, as well as on the costs of manufacture.

Next, with reference to FIGS. 7A to 7I which illustrate the main processing steps, the description will be made of another method for manufacturing a liquid discharge recording head in accordance with the present invention.

For the liquid discharge recording head of the present embodiment, it is not arranged to form the PZT directly on the substrate, but to separate the step of forming the PZT by use of an intermediate transfer member, the step of forming the pressure chamber (liquid chamber), and the step of bonding them. In this way, it becomes possible to separate the film formation process that uses lead. Further, this method makes it easier to obtain a strong junction even when bonding is made with a substrate the lattice constant of which is different. This is the feature different from the embodiments described earlier. Particularly, with the lower temperature which is made applicable here, the range of material selection becomes wider for the substrate that includes the pressure chamber with the possibility of lowering costs, because it is known for the technique to bond the PZT monocrystal with the monocrystal Si substrate or the substrate having a vibrating plate attached thereto that an amorphous intermediate layer is formed by the application of a temperature of 150° C. to 400° C., and then, an atomic level junction can be obtained.

Now, hereunder, with reference to FIGS. 7A to 7I, the description will be made of a method for manufacturing a liquid discharge recording head in accordance with the present embodiment.

At first, as shown in FIG. 7A, the monocrystal Pt electrode film 41 is orientated and formed in a thickness of 0.1 μm on the upper face of the monocrystal MgO substrate 40 having the (111) plane of 3 cm square as the upper face thereof.

Then, as shown in FIG. 7B, the Pt electrode film 41 is patterned using dry etching (by Ar ion in vacuum) so as to separate it into individual electrodes 41 corresponding to pressure chambers, respectively.

After that, as shown in FIG. 7C, the first layer (initial layer) 42 of $PbTiO_3$ is formed in a thickness of approximately 0.01 μm. Then, the PZT thin film 43 is formed by sputtering on the first layer 42 in a thickness of approximately 3 μm. Here, at this juncture, the substrate temperature is set at 500° C. to 600° C. to develop the film which is quickly cooled with a cooling speed of 50° C./min.

Then, as shown in FIG. 7D, the piezoelectric film 44 which is formed by the first layer 42 and the PZT thin film 43 is patterned by etching using strong acid solution to separate it into individual piezoelectric films 44 corresponding to the pressure chambers, respectively.

On each of the separated piezoelectric films 44, a common electrode is formed. Here, as the common electrode, the vibrating plate can be used dually. In this case, there is no need for the provision of any particular step of forming the common electrode. The embodiment illustrated in FIGS. 7A to 7I uses the vibrating plate 46 dually as common electrodes.

Also, as shown in FIG. 7E, the Ti is formed on the silicon monocrystal substrate 45 in a thickness of approximately 3 μm to make it the vibrating plate 46 which dually acts as the common electrode.

Then, as shown in FIG. 7F, the silicon substrate 45 is partially etched for removal using hydrofluoric acid solution or potassium hydroxide solution, thus forming the pressure chambers 47 and liquid flow paths on the silicon substrate.

After that, as shown in FIG. 7G, the MgO substrate 40 having the piezoelectric film 44, the electrodes 41, and others formed thereon, and the substrate main portion having formed thereon the silicon substrate 45 with the pressure chambers 47 and others, as well as the Ti vibrating plate 46, are superposed with the Ti layer 46 of the substrate main portion and the piezoelectric film 44 being positioning, and bonded without using any adhesives. In this way, the pressure chambers 47, the vibrating plate 46, and the PZT piezoelectric film 44 are integrally formed together.

Then, as shown in FIG. 7H, the MgO substrate 40 is removed by use of acid solution. The MgO substrate 40 can be dissolved stably by use of phosphoric acid solution without damaging the piezoelectric film 44.

Further, as shown in FIG. 7I, the nozzle plate 48 having the liquid discharge ports (nozzles) 49 of 10 μm diameter each, for example, formed at designated intervals thereon is installed on the substrate main portion, and each of the liquid discharge ports 49 is bonded to and communicated with each pressure chamber 47, hence manufacturing the liquid discharge recording head.

Also, as the variational example of the present embodiment, a liquid discharge recording head can be manufactured along with the process flow shown in FIGS. 8A to 8F.

Figure 8A:
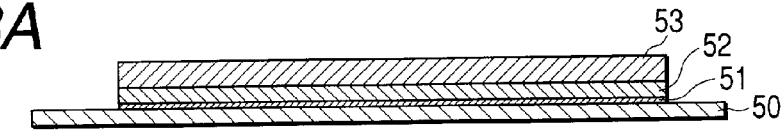
FIGS. 8A, 8B, 8C, 8D, 8E, and 8F are views which schematically illustrate the main steps of still another method for manufacturing the liquid discharge recording head of the present invention.

For the present embodiment, too, as shown in FIG. 8A, on the upper face of the monocrystal MgO substrate 50 having the (111) plane of 3 cm square as upper face, the monocrystal Pt electrode film 51 is orientated and formed in a thickness of 0.1 μm. Then, the PLT initial layer (first layer) 52 is formed in a thickness of approximately 0.01 μm, and the PZT thin film 53 is formed on the initial layer 52 by sputtering in a thickness of approximately 3 μm. Here, at this juncture, the substrate temperature is set at 500° C. to 600° C. to develop the film which is quickly cooled with a cooling speed of 50° C./min.

Figure 8B:
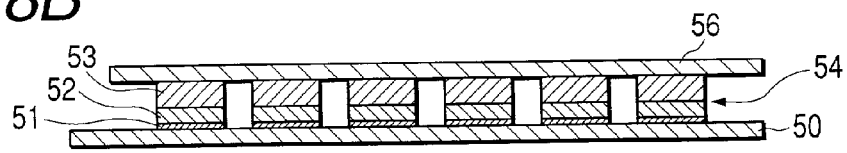

As shown in FIG. 8B, the piezoelectric film 54 formed by the initial layer 52 and the PZT thin film 53, and the Pt electrode 51 are patterned by etching to separate them into the individual electrode film 51 and the piezoelectric film 54. After that, Ti is formed thereon in a thickness of approximately 3 μm as the vibrating plate 56. This vibrating plate 56 dually functions as the common electrode.

Figure 8C:
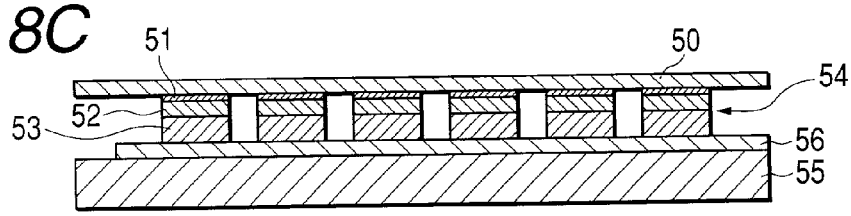

Subsequently, as shown in FIG. 8C, the silicon substrate 55, and the PZT intermediate transfer member of the MgO substrate 50 having the piezoelectric film 54, the electrodes 51, and others formed thereon are bonded directly without using adhesives.

Figure 8D:
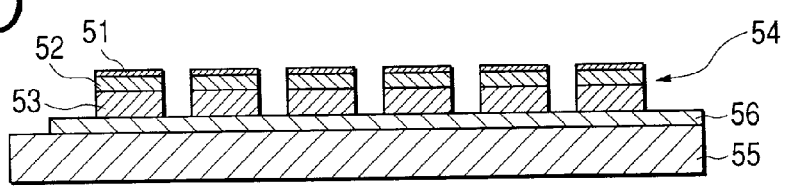
Figure 8E:
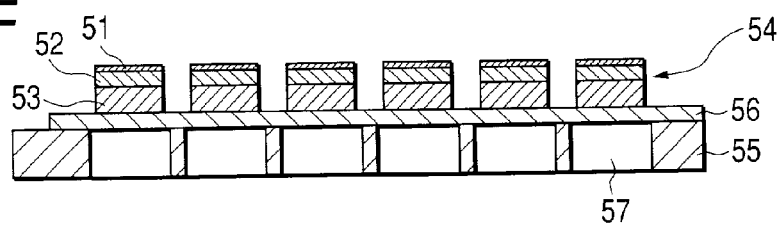

After that, as shown in FIG. 8D, the MgO substrate 50 is removed by use of acid solution, and then, as shown in FIG. 8E, the silicon substrate 55 is partially etched for removal by use of hydrofluoric acid solution or potassium hydroxide solution, thus forming the pressure chambers 57 on the silicon substrate 55.

Figure 8F:
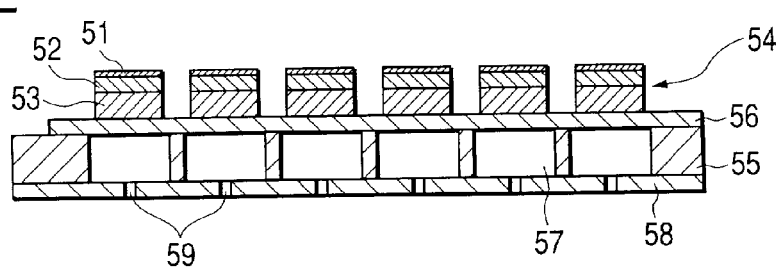

Then, as shown in FIG. 8F, the nozzle plate 58 having the liquid discharge ports (nozzles) 59 formed at designated intervals thereon is installed on the silicon substrate 55, and each of the liquid discharge ports 59 is bonded to and communicated with each pressure chamber 57, hence manufacturing the liquid discharge recording head.

In this respect, for the method of manufacture described with reference to FIGS. 7A to 7I and FIGS. 8A to 8F, the piezoelectric films 44 and 54, and the individual electrodes 41 and 51 are patterned before the common electrodes (dually functioning as the vibrating plates 46 and 56), but this patterning is not necessarily limited thereto. It may be possible to form the common electrodes at first, and then, to pattern the piezoelectric films 44 and 54, and the Pt individual electrodes 41 and 51 after the MgO substrates 40 and 50 are etched.

In accordance with the method of manufacture described above, it becomes possible to form a thin piezoelectric film having good piezoelectric characteristics. Then, by the application of microprocessing techniques used for semiconductor manufacturing, such thin piezoelectric film can be formed into the piezoelectric elements which correspond to extremely small pressure chambers, respectively, hence making it possible to manufacture an ink jet head having liquid discharge ports formed in high density.

In this respect, for each of the aforesaid embodiments, the description has been made with reference to specific materials and numerals appropriately, but the present invention is not necessarily limited to those materials and numerals thus described.

Also, as to the first layer (initial layer) of the piezoelectric film, the first layer 11 in FIG. 2 is a layer to form the second layer 12 having good crystallization, and the second layer 12 mainly carries the function as a film having the piezoelectric capability. Therefore, in order not to degrade the piezoelectric characteristics of the piezoelectric film 9 as a whole, the smaller the film thickness of the first layer 11, the better as far as it can carry the function to form the second layer 12 in good condition. The inventors hereof have confirmed that the first layer 11 can demonstrate the function thereof even when it is 5 nm or less when using a sputtering apparatus having good film thickness control. However, it is preferable to set the range of thickness within 30 nm to 100 nm for covering the Pt electrode evenly, as well as in consideration of control or the like in executing the processing steps. With the setting within this range, it is made possible to prevent the piezoelectric characteristics of the piezoelectric film 9 as a whole from being degraded essentially, while sufficiently demonstrating the effect on forming the second layer 12 in good quality. Further, it becomes possible to minimize the load that may be increased on the control and management of processing steps when executing the formation process of the piezoelectric film 9. Here, it has been confirmed that in accordance with the first embodiment, a liquid discharge recording head can be manufactured with a sufficient liquid discharge performance even at a low voltage by arranging the PZT layer to be the one having the PbTiO$_3$ layer in a film thickness of 0.2 μm as the first layer 11, and the Pb(Zr$_{0.53}$Ti$_{0.47}$)O$_3$ in a film thickness of 2.8 μm as the second layer 12.

Also, in accordance with the present invention, although the film thickness of the second layer 12 formed by PZT is not necessarily limited, it is preferable to set it at 10 μm or less, or particularly, at 8 μm or less, because when the film formation is executed by use of a thin film formation method, it takes a longer time to form the film if the film thickness is large. Also, the piezoelectric film 9 is patterned after the film formation to be in a designated shape corresponding to each of the pressure chambers, respectively. However, in consideration of the need which is expected to become increasingly more for the narrower intervals between liquid discharge ports from now on, it is further preferable to set the thickness of the piezoelectric film 9 at 5 μm or less so that patterning is made in good precision even in such a case as expected. Also, in consideration of the film strength and the stress to be created, the thickness of the piezoelectric film 9 should preferably be set at 0.5 μm or more. As a result of the studies of the inventors hereof, it is most preferable to set the thickness of the piezoelectric film 9 at a range of 1 to 4 μm. It has been confirmed that if the film thickness thereof is set within this range, such recording liquid as ink can be allowed to fly stably, while keeping the reliability of the film at a certain level or more.

For the embodiment illustrated in FIGS. 7A to 7I, the substrate main portion is formed by use of silicon 45 and titanium 46, but it is not necessarily limited thereto. It may be possible to from that portion by photosensitive organic polymeric material, photosensitive glass and single metallic material, or the like.

Also, the vibrating plate (designated by a reference numeral 5 in FIGS. 1A to 1C) can be processed finely using thin film process such as puttering. For the material thereof, YSZ or metallic titanium (Ti) for the embodiment described earlier, but the material is not necessarily limited thereto. Metal, such as nickel, chromium, or aluminum, or SiO$_2$ may be usable. These metals can also be formed with ease by use of sputtering method, vacuum deposition, and plating method to be able to obtain vibration characteristics in good condition as in the case of using metallic titanium. Also, with alumina used for the vibrating plate, the same effect can be obtained as in the case of using metallic titanium or SiO$_2$. The formation can also be made by sputtering method with ease. Besides, polyimide resin can be used for the vibrating plate. Polyimide resin can be formed easily by use of spin-coating method, and the microprocessing thereof is also ease. Therefore, this material is suitable for use of the vibrating plate of a liquid discharge recording head. Further, as the vibrating plate, a laminated complex material of ceramics and metal is adoptable for the provision of durability and tenacity.

By use of each of the materials described above, the vibrating plate can be formed without any deterioration that may bring about cracks or the like during vibration so as to generate sufficient vibrations for discharging recording liquid. Also, as the material of the vibrating plate, each metallic oxide is usable to obtain the same vibration characteristics. Further, with photosensitive polyimide used for the vibrating plate, it becomes easier to manufacture the element.

With the structure as described above, it is possible to generate the warping vibrations in good condition even by the application of a voltage of 50 V or less when the thickness of the vibrating plate 5 that faces the pressure chamber (designated by a reference numeral 3 in FIGS. 1A to 1C; hereinafter the same) is formed by SiO$_2$ layer in 2 μm, and also, the PZT thin film of 3 μm thick, which is expressed by the compositional formula of Pb(Zr$_{0.5}$Ti$_{0.5}$)O$_3$, and the platinum electrodes 7 and 8 of 0.1 μm thick each, are used as the second layer 12 of the piezoelectric film 9. However, in accordance with the present invention, the thickness of the vibrating plate 5 is not necessarily limited to 2 μm as described above. This thickness can be appropriately set in consideration of the piezoelectric characteristics of the piezoelectric film 9, as well as the inherent characteristics of vibration of the material that forms the vibrating plate 4, among some others.

Also, for the present invention, it is possible to form the piezoelectric film of lead dielectric layer having the perovskite structure with good crystallization using platinum, iridium, or ruthenium oxide. By use of the piezoelectric film formed on the electrodes using any one of those materials, the piezoelectric film can be made in the plural number without small variation of characteristics, hence making it possible to minimize the variation between the elements with respect to the liquid discharge capability. Also, the common electrode may be formed to be an continuous one to cover a plurality of piezoelectric films. However, the common electrode may be comb-shaped as the individual electrode per pressure chamber. Particularly for the piezoelectric film orientated in the direction (111), the engineer domain is created in the domain structure thereof. Thus, it is preferable to make it the comb-shaped electrode that may apply the electric field in the horizontal direction with respect to the piezoelectric film, while making the polarization process possible in an arbitrary direction. In this way, a high piezoelectric performance can be obtained.

Also, for the microprocessing of the PZT thin film, a solution of strong acidity, such as hydrofluoric acid or nitric acid, is used, but using platinum, iridium, or ruthenium oxide for the electrode, it becomes possible to prevent the electrode material from being corroded in order to stabilize the production of the elements. Also, for the PZT used as the piezoelectric material of the second layer that forms the piezoelectric film, it is preferable to use the PZT layer having the Zr/Ti ratio that presents the good piezoelectric characteristics to be within a range of 30/70 to 70/30. Also, in accordance with the present invention, the piezoelectric material that contains the elements other than Pb, Ti, and Zr having the composition of $Pb_{0.99}Nb_{0.02}[(Zr_{0.6}Sn_{0.4})_{1-y}Ti_y]_{0.98}O_3$ ($0.060 \leq y \leq 0.065$) or the like, for example, besides the aforesaid PZT. In this respect, the $Pb_{0.99}Nb_{0.02}[(Zr_{0.6}Sn_{0.4})_{1-y}Ti_y]_{0.98}O_3$ ($0.060 \leq y \leq 0.065$) is the antiferroelectric material, but there is no problem. In this case, the discontinuous displacement characteristics appear at a voltage of 15V due to the phase transition from the antiferroelectrics to the ferroelectrics, and at a voltage of 20V, a displacement of approximately 0.8 μm occurs. When a voltage of 20V or more is applied, almost constant displacement is generated, thus making it possible to make the variation of discharge amounts of liquid small. Further, with the antiferroelectric film having the composition of $Pb_{0.99}Nb_{0.02}[(Zr_{0.6}Sn_{0.4})_{1-y}Ti_y]_{0.98}O_3$ ($0.060 \leq y \leq 0.065$), it becomes possible to from the piezoelectric element having a stabilized liquid discharge capability even with the thin polycrystalline film.

In this respect, the Table 3 shows one example of the materials each for the monocrystal substrate, the vibrating plate, the electrode, and the first layer (of the piezoelectric film), respectively. Then, if only the lattice size of combined materials is arranged to part by 30% or more from each other, it becomes possible to obtain the monocrystal PZT orientated in (100) or (111) by appropriately combining those materials.

TABLE 3

| | Substrate | Vibrating Plate | Buffering Film | Electrode | First Layer |
|---|---|---|---|---|---|
| PZT (100) Monocrystal | Si(100) Si(111) MgO(100) SrTiO$_3$(100) SiO$_2$ | YSZ SiO$_2$ Al$_2$O$_3$ Ti/Cr/SUS BdopedSi | TiO$_2$ SiO$_2$ TiN ZrN | Pt SRO Au Cr/SUS/Ti | PbTiO$_3$ PLT BaTiO$_3$ CaTiO$_3$ |
| PZT (111) Monocrystal | Si(100) Si(111) MgO(111) SrTiO$_3$(111) | YSZ SiO$_2$ Al$_2$O$_3$ Ti/Cr/SUS BdopedSi | TiO$_2$ SiO$_2$ TiN ZrN | Pt SRO Au Cr/SUS/Ti | PbTiO$_3$ PLT BaTiO$_3$ CaTiO$_3$ |

What is claimed is:

1. A method for manufacturing a piezoelectric element structure having a supporting substrate and a piezoelectric single crystal film or a piezoelectric single orientational crystal film supported on the supporting substrate, said method comprising the steps of:

forming by a vapor method on the supporting substrate, in this order, a first layer having a perovskite structure and a second layer having a perovskite structure and zirconium, a temperature at a time of deposition of the first and second layers being at least 500° C. during the vapor method, and the first layer being formed so as to contain no zirconium or an amount of zirconium less than an amount of zirconium contained in the second layer; and subsequently cooling from the deposition temperature at least to 450° C. with a cooling speed of at least 30° C./minute.

2. A method for manufacturing a piezoelectric element structure according to claim 1, further comprising forming an intermediate layer in which the zirconium concentration increases inclinatorily from the first layer to the second layer, after the formation of the first layer and before the formation of the second layer.

3. A method for manufacturing a piezoelectric element structure according to claim 1, wherein in the forming step the ratio of zirconium/titanium in the second layer is set to be at least 30/70 and at most 70/30.

4. A method for manufacturing a piezoelectric element structure according to claim 1, further comprising forming the piezoelectric film so as to have an orientation in the direction (100).

5. A method for manufacturing a piezoelectric element structure according to claim 1, further comprising arranging an electrode on each side of the piezoelectric film, forming the piezoelectric film so as to have an orientation in the direction (111), and forming the electrodes to be comb-shaped or to be arranged on an entire face of the piezoelectric film.

6. A method for manufacturing a piezoelectric element structure according to claim 1, further comprising forming the piezoelectric film so as to have a thickness of at most 10 μm.

7. A method for manufacturing a piezoelectric element structure according to claim 1, further comprising forming the piezoelectric film so as to have a thickness of at least 1 μm and at most 4 μm.

8. A method for manufacturing a piezoelectric element structure according to claim 1, further comprising forming the first layer of the piezoelectric film so as to have a thickness of at least 30 nm and at most 100 nm.

9. A method for manufacturing a piezoelectric element structure according to claim 1, wherein the second layer of the piezoelectric film contains niobium, tin, and manganese, and provides antiferroelectric characteristics.

10. A method for manufacturing a piezoelectric element structure having a supporting substrate and a piezoelectric single crystal film or a piezoelectric single orientational crystal film supported on the supporting substrate, said method comprising the steps of:

forming by a vapor method on the supporting substrate, in this order, a first layer having a perovskite structure and a second layer having a perovskite structure and an element for preventing crystallization growth during a thin film forming process, a temperature at a time of deposition of the first and second layers being at least 500° C. during the vapor method, and the first layer being formed so as to contain none of the element or an amount of the element less than an amount of the element contained in the second layer; and subsequently cooling from the deposition temperature at least to 450° C. with a cooling speed of at least 30° C./minute.

11. A method for manufacturing a piezoelectric element structure having a supporting substrate and a piezoelectric single crystal film or a piezoelectric single orientational crystal film supported on the supporting substrate, said method comprising the steps of:

forming by a vapor method on the supporting substrate a layer having a perovskite structure, a temperature at a time of deposition of the layer being at least 500° C. during the vapor method; and subsequently cooling from the deposition temperature at least to 450° C. with a cooling speed of at least 30° C./minute.

12. A method according to claim 11, wherein the temperature is a temperature of the supporting substrate.

* * * * *

UNITED STATES PATENT AND TRADEMARK OFFICE
CERTIFICATE OF CORRECTION

PATENT NO. : 7,120,978 B2
APPLICATION NO. : 09/880757
DATED : October 17, 2006
INVENTOR(S) : Kiyotaka Wasa et al.

It is certified that error appears in the above-identified patent and that said Letters Patent is hereby corrected as shown below:

COLUMN 3
Line 18, "is" should read --be--.

COLUMN 4
Line 67, "o" should read --to--.

COLUMN 5
Line 26, "side" should read --sides--.

COLUMN 6
Line 28, "porion" should read --portion--.

COLUMN 7
Line 52, "think" should read --thin--.

COLUMN 8
Line 3, "chamber 3," should read --chambers 3,--.
Line 16, "correspond" should read --corresponding--.
Line 34, "martial" should read --material--.
Line 42, "from" should read --form--.
Line 57, "think" should read --thin--.

COLUMN 13
Line 38, "thickness" should read --thicknesses--.

COLUMN 18
Line 1, "from" should read --form--.
Line 6, "puttering." should read --sputtering.--.

UNITED STATES PATENT AND TRADEMARK OFFICE
CERTIFICATE OF CORRECTION

PATENT NO. : 7,120,978 B2
APPLICATION NO. : 09/880757
DATED : October 17, 2006
INVENTOR(S) : Kiyotaka Wasa et al.

It is certified that error appears in the above-identified patent and that said Letters Patent is hereby corrected as shown below:

COLUMN 19
Line 20, "from" should read --form--.

Signed and Sealed this

Eighteenth Day of December, 2007

JON W. DUDAS
*Director of the United States Patent and Trademark Office*